United States Patent
Ku et al.

(10) Patent No.: US 7,181,028 B2
(45) Date of Patent: Feb. 20, 2007

(54) AUDIO CONVERTING DEVICE AND CONVERTING METHOD THEREOF

(75) Inventors: Shih-Yu Ku, HsinChu (TW); Wen-Chi Wang, HsinChu (TW); Yi-Shu Chang, HsinChu (TW); Chao-Cheng Lee, HsinChu (TW)

(73) Assignee: Realtek Semiconductor Corp., Hsinchu (TW)

( * ) Notice: Subject to any disclaimer, the term of this patent is extended or adjusted under 35 U.S.C. 154(b) by 666 days.

(21) Appl. No.: 10/103,303

(22) Filed: Mar. 21, 2002

(65) Prior Publication Data

US 2002/0136417 A1   Sep. 26, 2002

(30) Foreign Application Priority Data

Mar. 22, 2001  (TW)  ................................. 9010674 A

(51) Int. Cl.
*H03G 7/00* (2006.01)
*H04B 15/00* (2006.01)

(52) U.S. Cl. ...................................... 381/106; 381/94.1
(58) Field of Classification Search ............... 381/94.1, 381/102, 98, 101, 104, 106, 107, 94.5; 333/14; 455/72; 700/94
See application file for complete search history.

(56) References Cited

U.S. PATENT DOCUMENTS

| 5,027,410 | A | * | 6/1991 | Williamson et al. | ......... 381/320 |
| 5,065,433 | A | * | 11/1991 | Ida et al. | ........................ 381/63 |
| 5,896,291 | A | * | 4/1999 | Hewitt et al. | .................. 700/94 |
| 6,044,307 | A | * | 3/2000 | Kamiya | ....................... 700/94 |

* cited by examiner

*Primary Examiner*—Xu Mei
(74) *Attorney, Agent, or Firm*—Rabin & Berdo, P.C.

(57) ABSTRACT

An audio converting device including a digital high-pass filter, an expander, a digital low-pass filter, a delta-sigma modulator, a digital-to-analog converter, an analog low-pass filter and a gain control unit is provided. The digital high-pass filter in this invention can filter out a direct-current component of digital audio data such that the production of noise is avoided when the volume is adjusted by users.

14 Claims, 8 Drawing Sheets

AUDIO CONVERTING DEVICE AND CONVERTING METHOD THEREOF

This application claims priority from Taiwanese application no. 90106724, filed in Taiwan, R.O.C., on Mar. 22, 2001, pursuant to 35 U.S.C. 119(a)–(d).

BACKGROUND OF THE INVENTION

1. Field of the Invention

The present invention relates to an audio converting device that does not produce noise when adjusting the gain of an audio amplifier in a digital audio system.

2. Description of the Related Art

Generally, a digital audio system can convert digital data to analog signals and play them through analog devices, such as loudspeakers. Furthermore, the digital audio system can also convert analog signals to digital data for transmission or storage. Such a digital audio system is called an Audio Codec. FIG. 1 shows a block diagram of a typical Audio Codec 60. In FIG. 1, a digital-to-analog converter (DAC) 20 converts digital data to analog signals through a digital interface 10. An analog mixing and gain control unit 30 adjusts the amplitudes of the analog signals, thereby adjusting volume. The analog mixing and gain control unit 30 can also mix the analog signals from several stereo or mono sources. The analog mixing and gain control unit 30 adjusts the amplitudes of the analog signals from each source and mixes them to be in condition for output. In addition, the analog mixing and gain control unit 30 is connected to an analog-to-digital converter (ADC) 40. Then, the analog signals are converted to digital data for further process through the digital interface 10.

In the Audio Codec, ADC and DAC can be implemented by several conventional technologies. FIG. 2 shows a typical block diagram of a DAC structure in an Audio Codec based on a delta-sigma modulation. Digital audio data DS10 are upsampled by an expander 100 and, then, fed into digital delta-sigma modulator 300 through a digital low-pass filter (digital LPF) 200. The digital delta-sigma modulator 300 then outputs one-bit stream DS40. A one-bit digital-to-analog converter (DAC) 400 converts the bit stream DS40 to analog signals AS50. Then, an analog low-pass filter 500 filters out the high-frequency noise in the analog signals AS50 and outputs filtered analog signals AS60.

For most audio systems, the volume, or the amplitude of the filtered analog signals, is adjustable by users. For example, the volume can be increased/decreased by every 0.5 dB within the range of 32 dB. FIG. 3 shows a diagram of a controllable amplifier in the analog mixing and gain control unit 30, wherein the variable-resistor Rt might have discrete values and is used to select different gains of the amplifier when users adjust the volume.

However, if the filtered analog signals AS60 inputted to the analog mixing and gain control unit 30 have a nonzero direct-current value, the output of the controllable amplifier may vary steeply as long as that the variable resistor Rt is adjusted steeply (every 0.5 dB) by users. As shown in FIG. 4, the filtered analog signals are amplified at time t with a different gain according to the variable resistor Rt due to adjustment by users. Due to the adjustment of the gain and the DC value in the analog signals, the waveform of analog outputs has a step height occurring at time t as shown in FIG. 4. This occurrence of the step height means high frequency noise in the output. The user, as a result, will hear unpleasant noise from connected loudspeakers. Further, the larger the direct-current value and the gain variation, the louder the noise is.

SUMMARY OF THE INVENTION

In view of this, an object of the present of the invention is to avoid producing noise when the volume is adjusted by users.

To obtain the object above, the present invention provides an audio input converting device comprising a digital high-pass filter, a DAC and a gain control unit. The digital high pass filter filters out a direct current component in audio data. The DAC for converts final filtered audio data to audio signals with an analog form. The gain control unit with an adjustable gain amplifies the audio signals.

Since the DC component in the audio data is filtered out before enter the DAC, no DC voltage is output from the DAC. Therefore, the gain control amplifies audio signals with no DC voltage, such that no noise occurs when the gain of the gain control unit is steeply adjusted.

The DAC in this invention, for example, is a part of a delta-sigma DAC, which usually includes an expander, a digital low pass filter, a delta-sigma modulator and a DAC converter. The digital high pass filter can be located at any place in the decoding path ahead of the DAC. For example, the location between the expander and the digital low pass filter, or the location between the digital low pass filter and the delta-sigma modulator.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Embodiments of the present invention will be described below with reference to the drawings.

Figure 1:
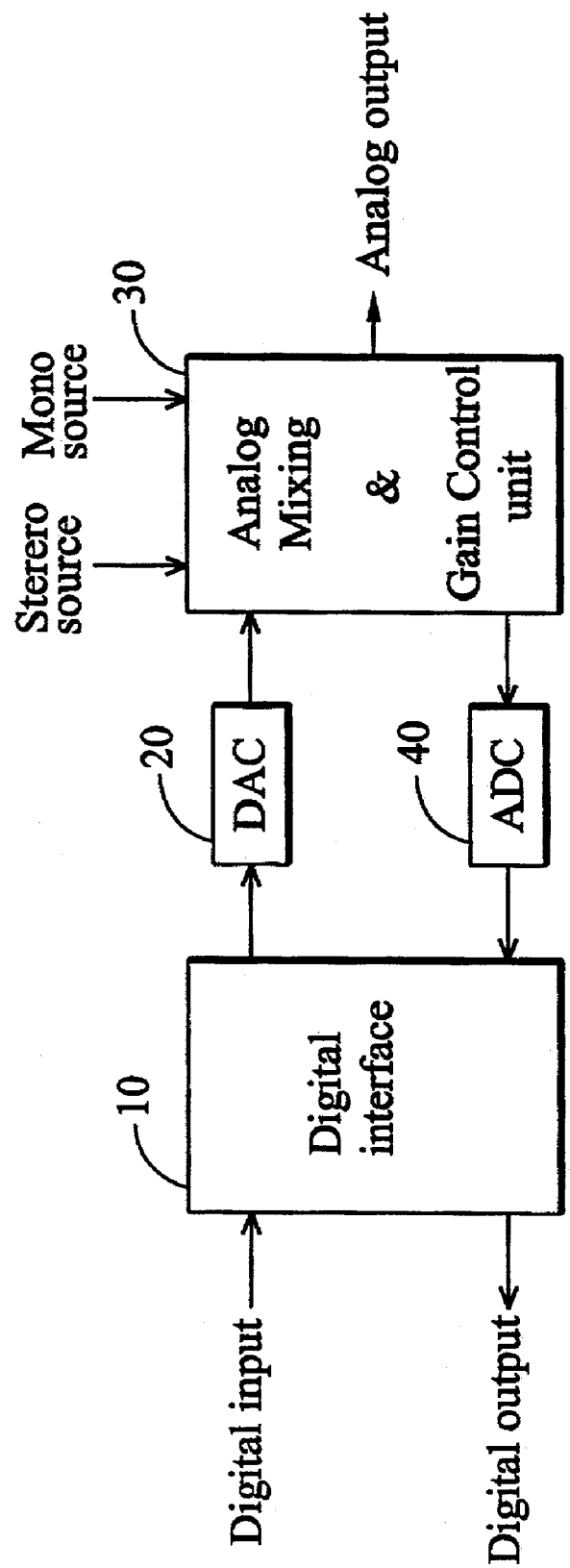
FIG. 1 is a block diagram of a typical Audio Codec.
Figure 2:
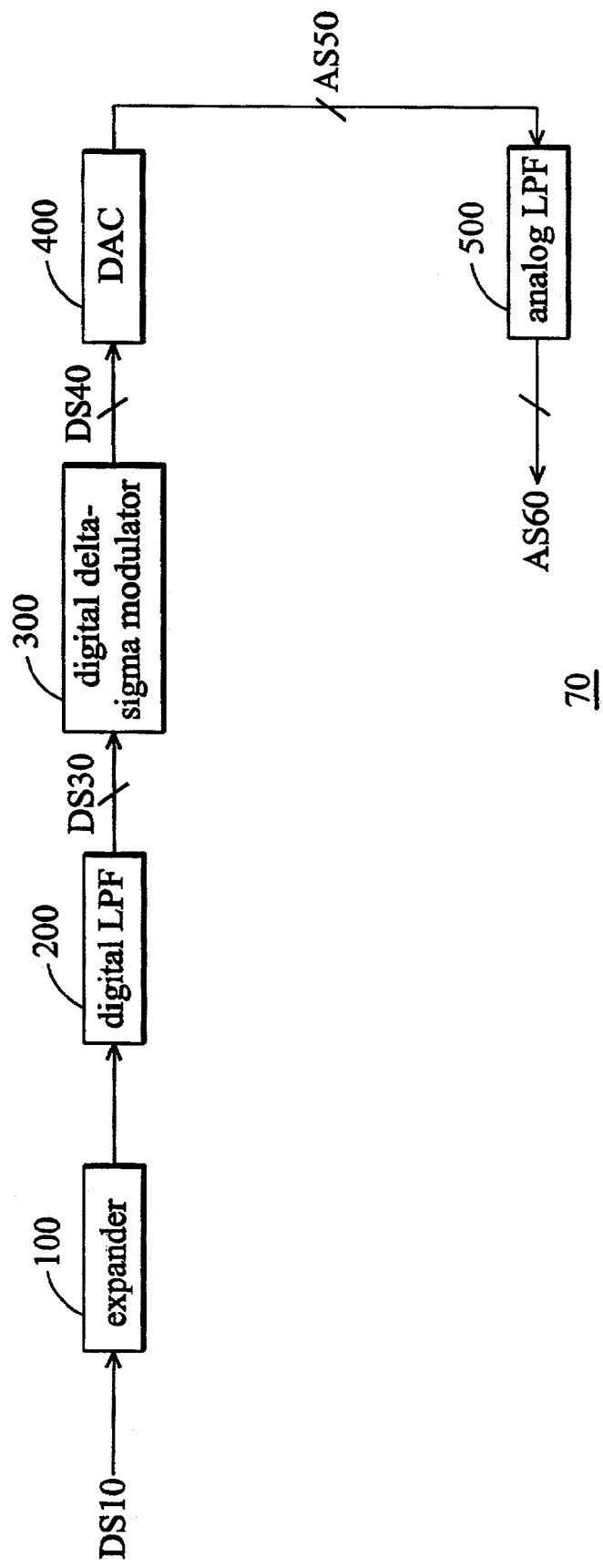
FIG. 2 is a block diagram of a typical digital-to-analog converter in an Audio Codec using a delta-sigma modulator.
Figure 3:
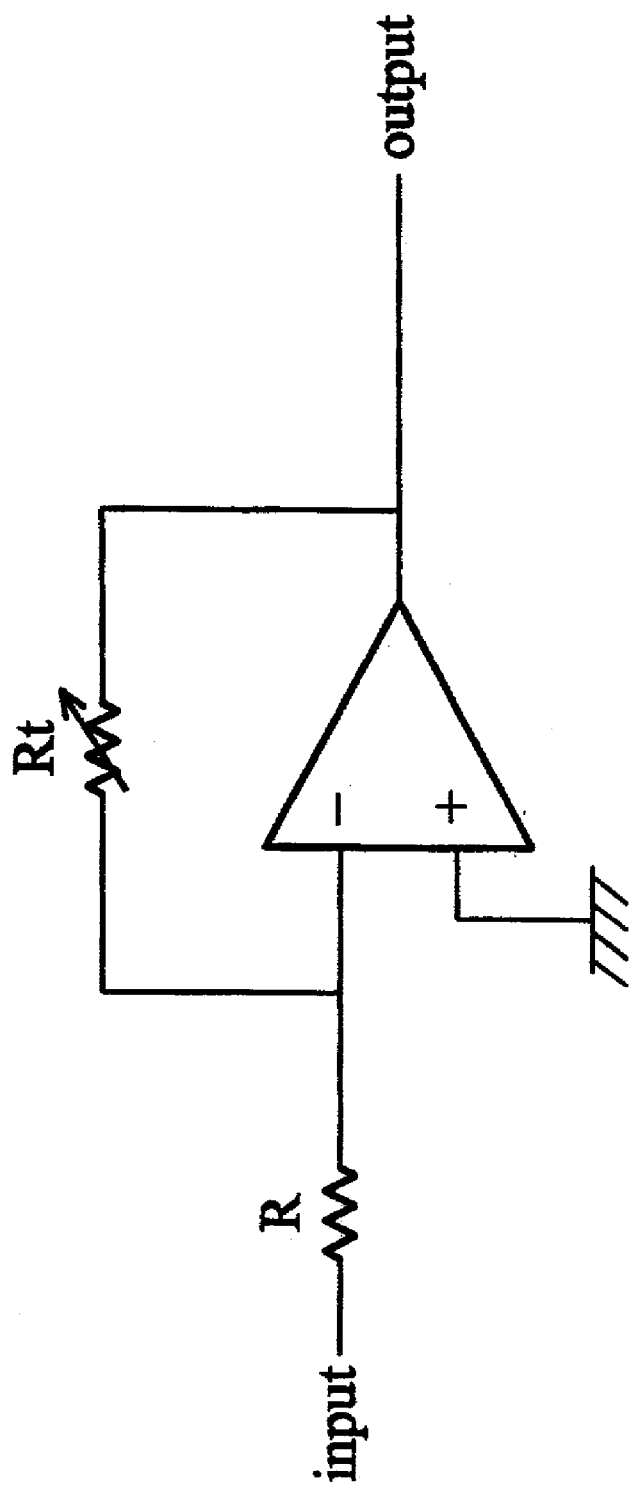
FIG. 3 shows a diagram of the analog mixing and gain control unit 30.
Figure 4:
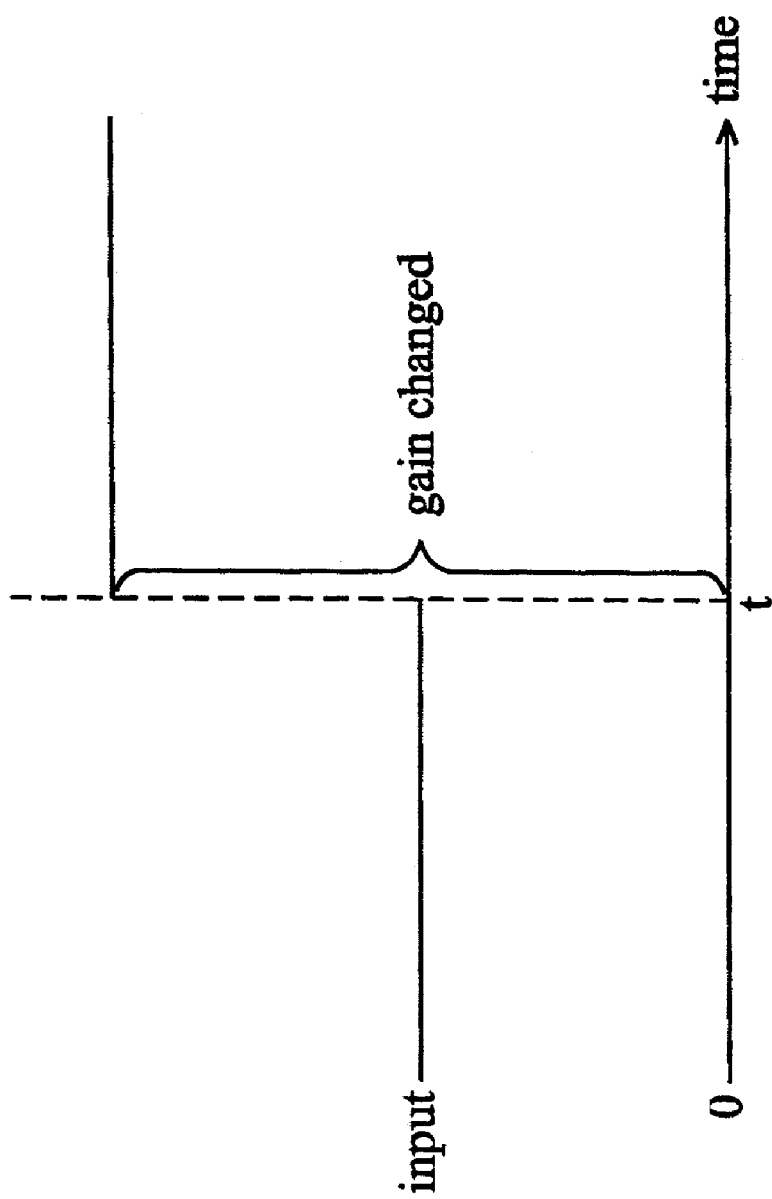
FIG. 4 shows the analog signal with a different gain according to the variable resistor Rt.
Figure 5:
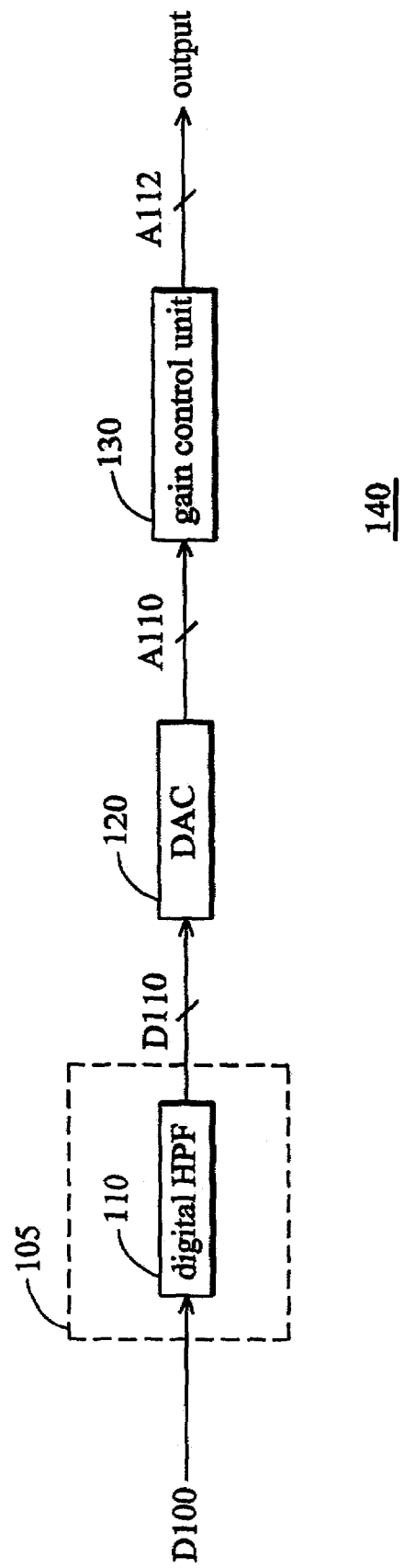
FIG. 5 shows a block diagram of an audio converting device of the first embodiment of the present invention.

FIG. 5 shows a block diagram of the audio converting device according to the present invention. In FIG. 5, the audio converting device 140 comprises a digital high-pass filter 110, a digital-to-analog converter 120 and a gain control unit 130.

The digital high-pass filter 110 receives first digital audio data D100 and filters out direct-current component of first digital audio data D100 to become second digital audio data D110. Second digital audio data D110, without the direct-current component, are then converted to analog audio signals A110 by the digital-to-analog converter (DAC) 120.

The gain control unit 130 is coupled to the digital-to-analog converter DAC 120 to adjust the gain of the analog audio signals A110 when users adjust the volume. Afterward, the gain control unit 130 outputs the analog audio signals A112 to, for example, loudspeakers. Each of the data converted by the DAC can be received in a form with several bits. The DAC can be a one-bit digital-to-analog converter, which receives data bit by bit. The DAC can also be a Nyquist converter or a delta-sigma converter. Further, the −3 dB corner frequency of the high-pass filter 110 is below 20 Hz, which is the lowest frequency audible by human being.

The present invention provides a digital high-pass filter 110 in the decoding path ahead of the DAC, thereby filtering out the direct-current component in first digital audio data D100. Consequently, second digital audio data D110 are sent to the digital-to-analog converter 120 without a direct-current component. Therefore, no DC component occur in the output of DAC. Afterward, the noise due to the gain of the gain control unit and the DC component from the DAC is avoided when adjusting the gain of the gain control unit 130. In other words, the audio converting device of the present invention can avoid noise when adjusting the volume of the audio converting device by filtering out the direct-current component of the audio input with a digital high-pass filter.

Figure 6:
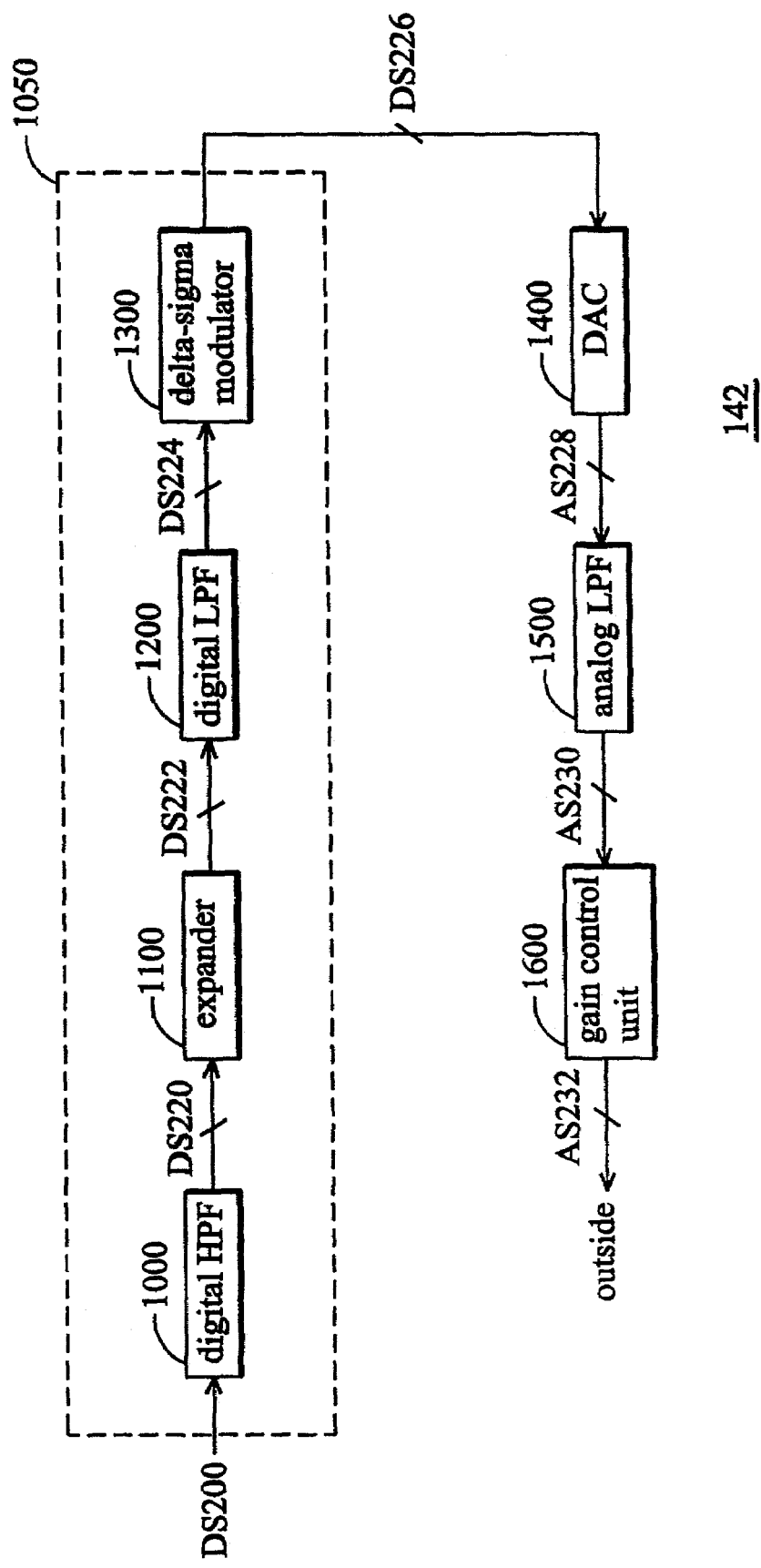
FIG. 6 shows a block diagram of an audio converting device of the second embodiment of the present invention.

FIG. 6 shows another block diagram of the audio converting device according to the present invention. In FIG. 6, besides the digital high-pass filter 1000 and the gain control unit 1600, the audio converting device 142 has an expander 1100, a digital low pass filter 1200, a delta-sigma modulator 1300, a digital-to-analog converter 1400 and an analog low pass filter 1500. The expander 1100, the digital low pass filter 1200, the delta-sigma modulator 1300 and the digital-to-analog converter 1400 together form a delta-sigma DAC.

The digital high-pass filter 1000 is used for filtering out direct-current component of digital audio data DS200 and outputs first audio data DS220. The expander 1100, coupled to the digital high-pass filter 1000, increases the code length and sample rate of the first audio data DS220 and outputs expanded digital audio data DS222. Further, the digital low-pass filter 1200, coupled to the expander 1100, filters out the high-frequency noise, or the image bands induced by the expander 1100, in the expanded audio data DS222 and outputs filtered audio data DS224. The delta-sigma modulator 1300 modulates the filtered audio data DS224 and outputs modulated audio data DS226.

Furthermore, the DAC 1400 converts the modulated audio data DS226 from a digital form to an analog form, thereby outputting analog audio signals AS228. The analog low-pass filter 1500, coupled to the digital analog converter 1400, filters out high frequency noise in the analog audio signals AS228 and outputs filtered audio signals AS230. The gain control unit 1600 controls the gain to amplify the filtered audio signals AS230 and outputs the amplified audio signals AS232 to other devices, such as loudspeakers. In other word, the gain control unit 1600 controls the sound volume of the audio converting device.

Since the DC component in the digital audio data DS200 has been filtered out by the digital high pass filter 1000 located in the decoding path of the audio converting device, no DC voltage will occur in the output of the DAC 1400. Therefore, there will be no noise while adjusting the gain of the gain control unit or the volume of the audio converting device, as occurs in the prior art.

For example, the DAC 1400 can be a one-bit DAC or a multi-bit DAC. Further, the −3 db corner frequency of the high-pass filter 1000 is generally below 20 Hz, which is the lowest audible frequency for human being. Therefore, the sound quality will not be effected due to the placement of the digital high pass filter 100 in the present invention.

Figure 7:
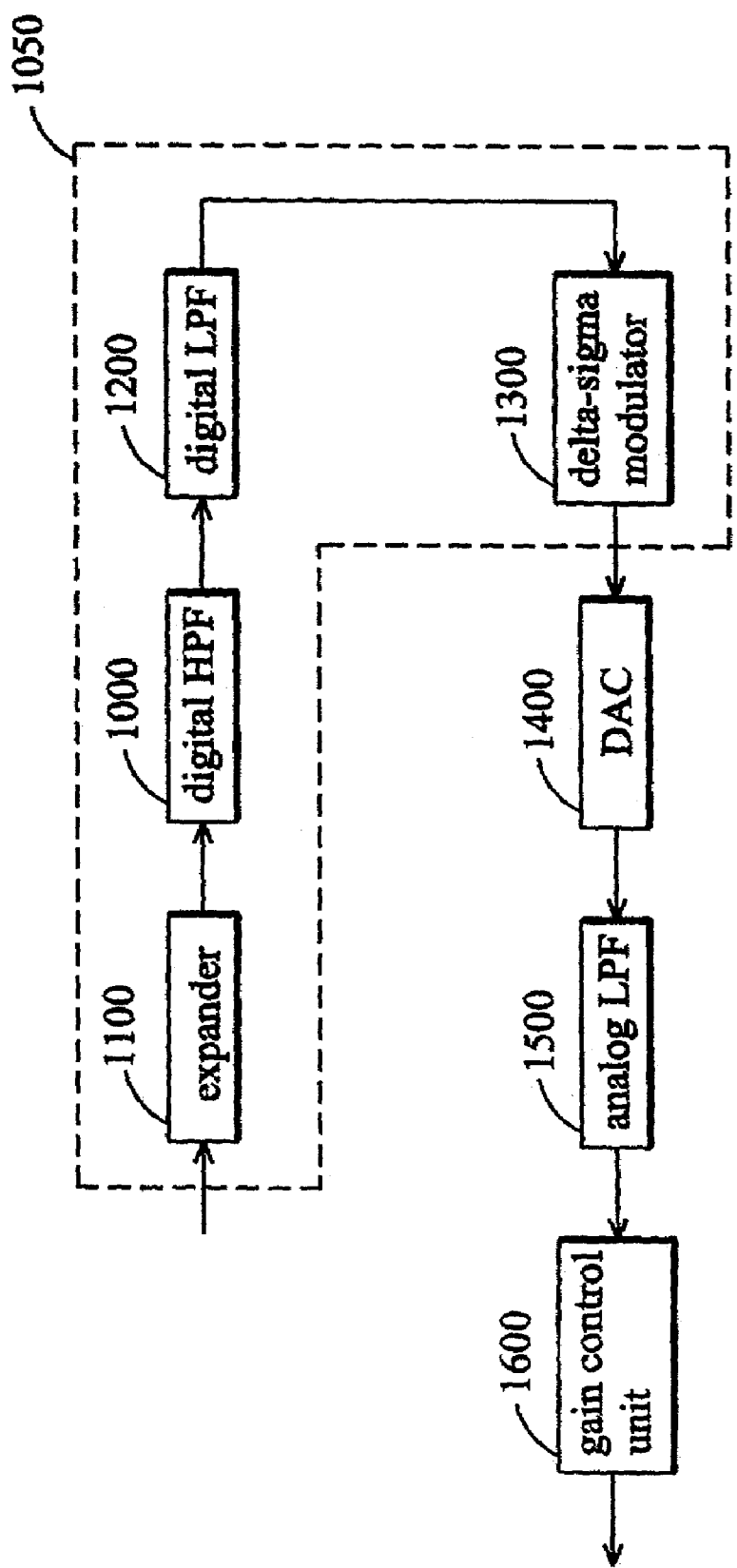
FIGS. 7 and 8 show two different locations for the high pass filter in the audio converting device.
Figure 8:
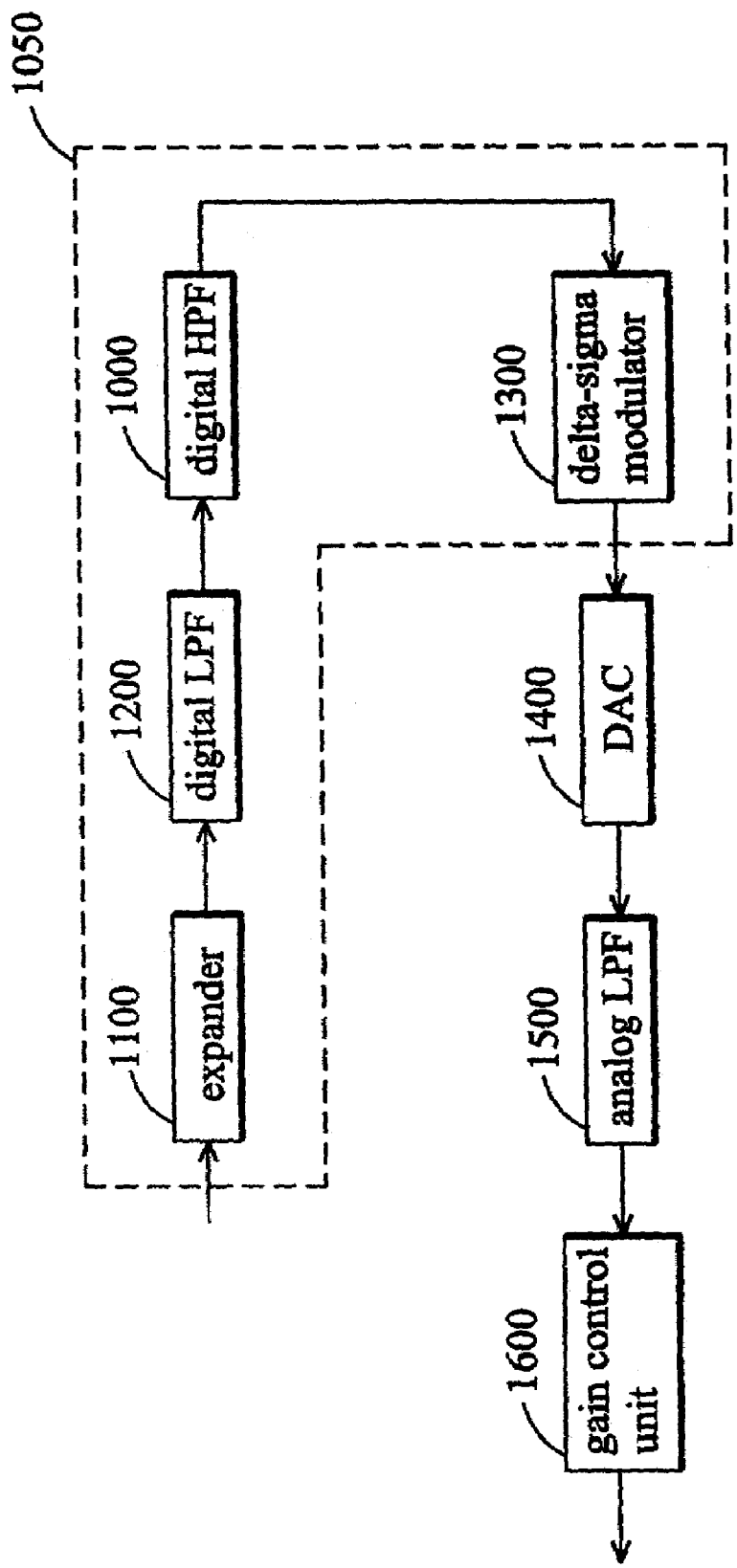

FIGS. 7 and 8 show two different locations for the high pass filter in the audio converting device. For brevity, the elements in FIGS. 7 and 8 that are the same as or similar to the elements in FIG. 6 are marked with the same numerals or notations. In FIG. 7, the digital high-pass filter 1000 is inserted between the expander 1100 and the digital low-pass filter 1200 to filter out the direct-current component of the audio data from the expander 1100. In FIG. 8, the digital high-pass filter 1000 is inserted between the digital low pass filter 1200 and the delta-sigma modulator 1300 to filter out the DC component from the digital LPF 1200. Therefore, DAC 1400 outputs no DC voltage and the audio converting devices shown in FIGS. 7 and 8 can avoid generating noise when the volume of an audio signal is adjusted.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An audio converting device for preventing noise during volume adjustment, the audio converting device comprising:
    a digital high pass filter for filtering out a direct-current component in first audio data and outputting second audio data;
    an expander for upsampling the second audio data and outputting upsampled audio data;
    a digital low pass filter for filtering out the image bands in the upsampled data to output third audio data;
    a modulator for modulating the third audio data into fourth audio data;
    a digital-to-analog converter for converting the fourth data into an analog audio signal;
    an analog low pass filter for filtering out high frequency noise in the analog audio signal to output a filtered audio signal; and
    a gain control unit with a adjustable gain to amplify the filtered audio signal.

2. The audio converting device as claimed in claim 1, wherein a −3 dB corner frequency of the digital high pass filter is below 20 Hz.

3. The audio converting device as claimed in claim 1, wherein the fourth audio data are outputted bit by bit.

4. The audio converting device as claimed in claim 1, wherein the fourth audio data are outputted in a form with several bits.

5. The audio converting device as claimed in claim 1, wherein the digital to analog converter is a one-bit DAC.

6. An audio converting device for preventing noise during volume adjustment, the audio converting device comprises:
    a digital high pass filter for filtering out a direct current component in audio data;
    a DAC for converting the final filtered audio data to audio signals;
    a gain control unit with an adjustable gain to amplify the audio signals;
    an expander for upsampling the audio data and outputting upsampled data; and a digital low pass filter for filtering out image bands in the upsampled data to output first filtered data in order to be processed by the DAC.

7. The audio converting device as claimed in claim 6, wherein the audio converting device further comprises a modulator for modulating the first filtered data into modulated audio data.

8. The audio converting device as claimed in claim 7, wherein the audio converting device further comprises an analog low pass filter for filtering out high frequency noise in the modulated data to become the final filtered audio data.

9. The audio converting device as claimed in claim 6, wherein the DAC is a Nyquist converter.

10. The audio converting device as claimed in claim 6, wherein a −3dB corner frequency of the digital high pass filter is below.

11. The audio converting device as claimed in claim 6, wherein the DAC is an one-bit DAC.

12. A method for processing a audio data sequence without making noise in a output terminal, the method comprising:
    filtering out a DC component in audio data;
    upsampling the audio data to increase the sampling rate of the audio data;
    filtering out image bands in upsampled audio data by a low pass filter;
    modulating filtered audio data from the low pass filter by a modulator;
    converting modulated data by a DAC;
    filtering out high frequency noise in converted signals outputted by the DAC; and
    amplifying filtered signals by a gain control unit with an adjustable gain.

13. An audio converting device for avoiding noise during volume adjustment, the audio converting device comprising:
    an expander for upsampling audio data and outputting upsampled audio data;
    a digital high pass filter for filtering out a direct-current component in the upsampled audio data and outputting first filtered audio data;
    a digital low pass filter for filtering out the image bands in the first filtered audio data to output second filtered audio data;
    a modulator for modulating second filtered data sequence into modulated audio data;
    a digital-to-analog converter, for converting the modulated audio data to analog audio signals;
    a analog low pass filter for filtering out high frequency noise in the analog audio signals to output filtered audio signals; and
    a gain control unit with an adjustable gain to amplify the filtered audio signals.

14. An audio converting device for avoiding noise during volume adjustment, the audio converting device comprising:
    an expander for upsampling first audio data and outputting an upsampled data;
    a digital low pass filter for filtering out the image bands in the upsampled data and outputting a second audio data;
    a digital high pass filter for filtering out a direct-current component in the second audio data and outputting a first filtered data;
    a modulator for modulating the first filtered data into a modulated audio data;
    a digital-to-analog converter for converting the modulated audio data to analog audio signals;
    a analog low pass filter for filtering out high frequency noise in the analog audio signals and outputting filtered audio signals; and
    a gain control unit with an adjustable gain to amplify the filtered audio signals.

* * * * *